United States Patent
Kim et al.

(10) Patent No.: US 9,343,175 B2
(45) Date of Patent: May 17, 2016

(54) FUSE DATA READING CIRCUIT HAVING MULTIPLE READING MODES AND RELATED DEVICES, SYSTEMS AND METHODS

(71) Applicant: Samsung Electronics Co., Ltd.

(72) Inventors: Gil-Su Kim, Hwaseong-si (KR); Jong-Min Oh, Seoul (KR); Sung-Min Seo, Seoul (KR); Je-Min Ryu, Seoul (KR); Seong-Jin Jang, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 191 days.

(21) Appl. No.: 13/835,319

(22) Filed: Mar. 15, 2013

(65) Prior Publication Data

US 2013/0258748 A1  Oct. 3, 2013

(30) Foreign Application Priority Data

Apr. 2, 2012 (KR) .................. 10-2012-0033936

(51) Int. Cl.
 *G11C 17/00* (2006.01)
 *G11C 17/18* (2006.01)
 *G11C 7/14* (2006.01)
 *G11C 17/16* (2006.01)
 *G11C 29/00* (2006.01)

(52) U.S. Cl.
 CPC ........ *G11C 17/18* (2013.01); *G11C 7/14* (2013.01); *G11C 17/16* (2013.01); *G11C 29/789* (2013.01)

(58) Field of Classification Search
 CPC .......... G11C 17/16; G11C 17/18; G11C 7/14
 USPC ....................... 365/96, 210.1, 225.7
 See application file for complete search history.

(56) References Cited

U.S. PATENT DOCUMENTS

| | | | |
|---|---|---|---|
| 6,240,033 B1 | 5/2001 | Yang et al. | |
| 6,570,804 B1 | 5/2003 | Blodgett | |
| 6,577,551 B2 * | 6/2003 | Ito et al. | 365/225.7 |
| 6,642,757 B2 * | 11/2003 | Ikehashi et al. | 327/143 |
| 6,778,459 B2 | 8/2004 | Blodgett | |
| 7,116,603 B2 * | 10/2006 | Kanda et al. | 365/225.7 |
| 7,724,583 B2 * | 5/2010 | Byeon | 365/189.09 |
| 7,738,309 B2 * | 6/2010 | Jeon et al. | 365/225.7 |
| 7,738,310 B2 * | 6/2010 | Naso et al. | 365/225.7 |
| 7,746,719 B2 * | 6/2010 | Kang | 365/225.7 |
| 8,339,867 B2 * | 12/2012 | Siau | 365/189.05 |

(Continued)

FOREIGN PATENT DOCUMENTS

| KR | 10-0459206 | 1/2000 |
|---|---|---|
| KR | 10-0427036 | 10/2003 |

*Primary Examiner* — Viet Q Nguyen
(74) *Attorney, Agent, or Firm* — Muir Patent Law, PLLC

(57) ABSTRACT

A fuse data reading circuit is configured to read fuse data in multi-reading modes. The fuse data may be stored in a fuse array that includes a plurality of fuse cells configured to store fuse data. The fuse data reading circuit may include a sensing unit configured to sense the fuse data stored in the fuse cells of the fuse array, and a controller configured to control an operation of reading the fuse data stored in the fuse cells. The controller sets different sensing conditions for sensing the fuse data according to an operation period during the fuse data reading operation to read the fuse data. Methods include operations and use of the fuse data reading circuit.

21 Claims, 13 Drawing Sheets

(56) References Cited

U.S. PATENT DOCUMENTS

| | | | |
|---|---|---|---|
| 8,395,439 B2* | 3/2013 | Yoshida | 327/538 |
| 8,836,386 B1* | 9/2014 | Hwang | 327/143 |
| 2007/0081377 A1* | 4/2007 | Zheng et al. | 365/96 |
| 2008/0265907 A1* | 10/2008 | Wienchol | 324/550 |
| 2009/0067211 A1* | 3/2009 | Rahman | 365/96 |
| 2011/0255329 A1* | 10/2011 | Kaku | 365/148 |
| 2013/0258748 A1* | 10/2013 | Kim et al. | 365/96 |

* cited by examiner

FUSE DATA READING CIRCUIT HAVING MULTIPLE READING MODES AND RELATED DEVICES, SYSTEMS AND METHODS

CROSS-REFERENCE TO RELATED APPLICATION

This application claims priority under 35 U.S.C. §119 to Korean Patent Application No. 10-2012-0033936 filed on Apr. 2, 2012, the disclosure of which is hereby incorporated by reference in its entirety.

BACKGROUND

1. Field

Embodiments of the inventive concept relate to a fuse data reading circuit and, more particularly, to a fuse data reading circuit configured to read fuse data in multiple reading modes.

2. Description of Related Art

Due to the integration of memory cells with a large memory capacity into semiconductor memory devices, the amount of information preset and stored to determine the operating environment of the semiconductor memory devices has also increased. Fuse circuits may typically be used to store various pieces of information that determine the operation of the semiconductor memory devices.

For example, redundancy information regarding a defective memory cell (e.g., addresses of defective memory cells), direct-current (DC)-level trimming information and mode-register set (MRS) information regarding a semiconductor memory device may be stored in the fuse circuit. The MRS information may be used by the semiconductor memory device to control an internal operation. The MRS information stored in the fuse circuit may also be read by an external device, such as a memory controller, to control operation of the semiconductor memory device. In an alternative embodiment, other semiconductor devices may include the fuse circuit other than a semiconductor memory device.

A laser fuse, an electrical fuse, or an anti-fuse circuit may be employed as the fuse circuit. Connection of the laser fuse may be controlled with the irradiation of laser beams, and connection of the electrical fuse may be controlled with the application of electrical signals. An anti-fuse circuit (which also may be either a laser fuse or electrical fuse) may make the transition from a high-resistance state to a low-resistance state after being subject to a laser or an electrical signal.

The fuse circuit may be read during a power-up step. When an external voltage is initially applied to a semiconductor memory device, a power-up signal configured to drive the semiconductor memory device in response to the external voltage may be generated, and the operation of reading the fuse circuit may be enabled simultaneously with generation of a clock signal synchronized with the power-up signal.

In this case, after enabling the reading operation, output voltages of DC circuits of the semiconductor memory device may be put into unstable states, and a predetermined amount of time may be required to stabilize the output voltages of the DC circuits.

When the operation of reading the fuse circuit is performed under the same sensing conditions (e.g., a sensing voltage and/or a clock frequency) during normal device operation reading periods, although sufficient sensitivity may be provided during certain times (e.g., during certain environments), reading errors of the fuse data may occur at other times due to insufficient sensitivity (e.g., during an unstable environments). As a result, the semiconductor memory device may suffer from operating errors.

SUMMARY

Embodiments of the inventive concept provide a fuse data reading circuit configured to read fuse data with different sensing conditions in different operating environments, and systems and methods related thereto. Systems, devices and methods also comprise the fuse data reading circuit and its operation alone as well as combinations with other devices and/or operation of the fuse data reading circuit by other devices.

A fuse data reading circuit may comprise a fuse array including a plurality of fuse cells configured to store fuse data; a sensing circuit configured to sense the fuse data stored in the fuse cells of the fuse array; and a controller configured to control reading of the fuse data stored in the fuse cells, the controller being configured to control reading of the fuse data with a first reading mode having first fuse data sensing conditions and to control reading of the fuse data with a second reading mode having second fuse data sensing conditions different from the first fuse data sensing conditions, the controller being configured to select the first reading mode and second reading mode according to an operation period of the fuse data reading circuit.

The controller may be configured to control reading in the first reading mode during a transition period that occurs directly after the fuse data reading operation is enabled, and controller is configured to control reading in the second reading mode during a stabilized period that comes after the transition period. The first fuse data sensing conditions may cause higher sensitivity for sensing the fuse data during the transition period as compared to sensitivity for sensing the fuse data during the stabilized period caused by the second fuse data sensing conditions.

A start of the stabilized period may be determined in response to at least one of: a predetermined number of clocks of a clock signal being generated, the clock signal being used to read the fuse data, a predetermined amount of time having elapsed after the clock signal is generated, and an internal voltage of a device having reached a target voltage after an external voltage is applied.

The controller may be configured to control reading of the fuse data such that a sensing voltage applied to the fuse cells in the transition period is higher than a sensing voltage applied to the fuse cells in the stabilized period.

The controller may be configured to control reading of the fuse data such that a reference voltage applied to a sense amplifier of the sensing circuit in the transition period is lower than a reference voltage applied to the sense amplifier of the sensing circuit in the stabilized period.

The controller may be is configured to control reading of the fuse data such that a sensing current of a sensing current source of a sense amplifier circuit of the sensing circuit in the transition period is smaller than a sensing current of the sensing current source of the sense amplifier circuit of the sensing circuit in the stabilized period.

The controller may be configured to control a frequency of a clock signal used to read the fuse data such that the frequency of the clock signal is lower in the transition period than in the stabilized period.

Each of the plurality of fuse cells may comprise an anti-fuse.

Each of the fuse cells may comprise a fuse including a first end and a second end, and a selection transistor, the selection transistor including a gate terminal, a first source/drain and a second source/drain, the first source/drain of the transistor being connected to the first end of the fuse. The fuse array may comprise a plurality of rows and a plurality of columns, the plurality of fuse cells being disposed at respective intersections of the rows and the columns; a word reading line connected to second ends of fuses of a first set of the fuse cells; a word line connected to gate terminals of selection transistors of each of the first set of fuse cells; and a plurality of bit lines, each connected to the second source/drain terminal of a respective one of the selection transistors of the first set of the fuse cells.

The sensing circuit may include a plurality of sense amplifiers each having a first end connected to a respective one of the bit lines and having a second end connected to a reference voltage.

The controller may be configured to control reading of the fuse data to sequentially read the fuse data from the respective rows of the fuse array.

The controller may be configured to change sensing conditions so that the first sensing conditions and the second sensing conditions differ in at least one of: a sensing voltage applied to the word reading line and the reference voltage.

The sensing unit may include a plurality of sensing current sources each having a first end connected to a respective one of the bit lines and having a grounded second end. The controller may be configured to change sensing conditions so that first sensing conditions and the second sensing conditions include different currents of the sensing current sources.

The controller may be configured to change sensing conditions so that first sensing conditions and the second sensing conditions include a different frequency of a clock signal used to read the fuse data.

A method of reading fuse data within a semiconductor device, may comprise enabling a fuse data reading operation in response to application of a voltage external to the semiconductor device; reading fuse data under a first sensing condition for sensing the fuse data in a first mode; entering a second mode of the fuse data reading operation; and reading the fuse data under a second sensing condition for sensing the fuse data when the fuse data reading operation enters the second mode. The first sensing condition for sensing the fuse data in the first mode may be different from the second sensing condition for sensing the fuse data in the second mode.

The first sensing condition for sensing the fuse data in the first mode may cause a higher data sensing sensitivity of a sensing circuit configured to sense the fuse data than a data sensing sensitivity of the sensing circuit in the second mode.

A method of operating a semiconductor device may comprise, after power is applied to the semiconductor device, as part of a power-up sequence, receiving first data read from a fuse array during a first mode of the first semiconductor device with first sensing conditions; then, receiving second data read from the fuse array during a second mode of the first semiconductor device with second sensing conditions, the second sensing conditions being different from the first sensing conditions; and then, controlling operation of the first semiconductor device in response to the received first and second data.

The first sensing conditions may include reading the first data with a word reading line voltage having a first magnitude, and the second sensing conditions may include reading the second data with a word reading line voltage having a second magnitude, less than the first magnitude.

The first sensing conditions may include comparing a first reference voltage to voltages provided on bit lines of the fuse array by first fuse cells of the fuse array to determine data stored in the first fuse cells; and the second sensing conditions may include comparing a second reference voltage to voltages provided on bit lines of the fuse array by second fuse cells of the fuse array to determine data stored in the second fuse cells, the second reference voltage being higher than the first reference voltage.

The first sensing conditions may include applying a first control voltage to current sources connected to bit lines of the fuse array, and the second sensing conditions may include applying a second control voltage to the current sources, the first control voltage may be effective to cause reduced sensing currents of the current sources as compared to a sensing currents caused by the second control voltage.

The first sensing conditions may include reading the first data with a clock as the clock has a first frequency, and the second sensing conditions include reading the second data with the clock as the clock has a second frequency, the second frequency being higher than the first frequency.

Controlling operation of the first semiconductor device in response to the received first and second data may be performed by the first semiconductor device (e.g., internal control). Controlling operation of the first semiconductor device in response to the received first and second data may be performed externally, such as by a second semiconductor device, such as a memory controller.

Devices and systems may perform methods disclosed herein. Devices may comprise the semiconductor device containing the fuse array. Devices may include semiconductor devices external to a semiconductor device containing the fuse array, such as an external memory controller. Systems may include a first semiconductor device containing the fuse array, such as a memory device, and a second semiconductor device, such as a memory controller. Semiconductor devices may be embodied by chips and/or semiconductor packages.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
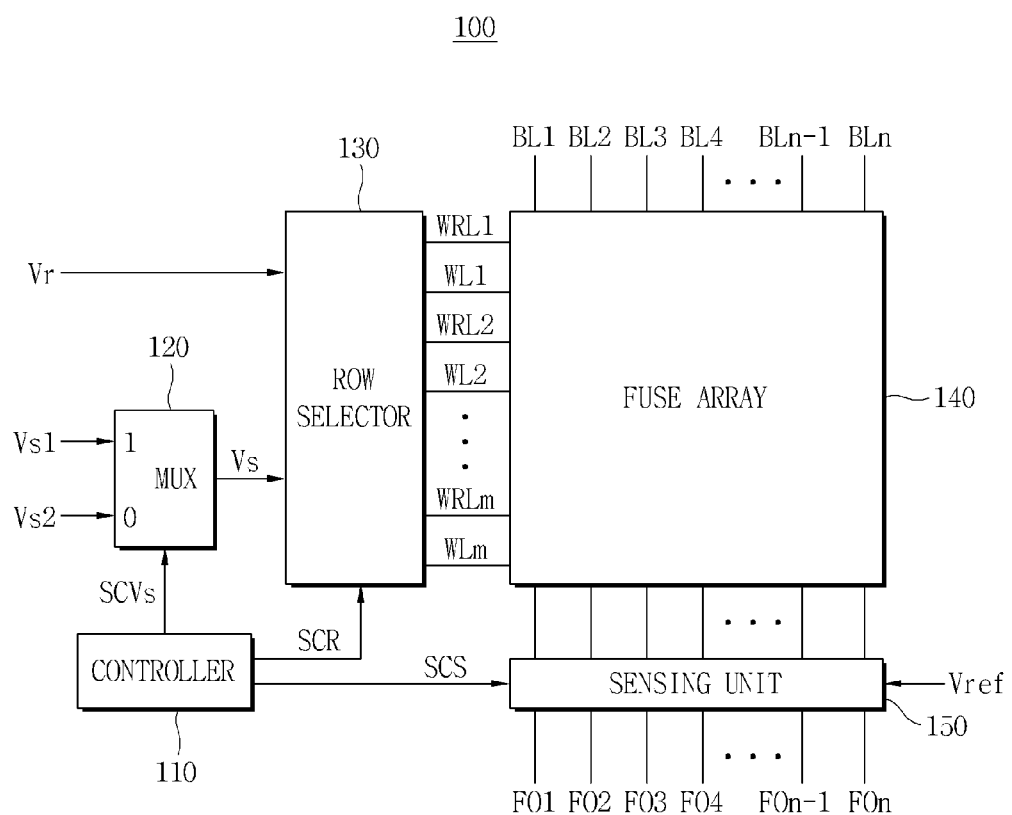
FIG. 1 is a block diagram of a fuse data reading circuit according to an embodiment of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "have," "having," "includes," "including," "comprises," and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the inventive concept may be performed otherwise. That is, the respective steps may be performed in a specified order, substantially at the same time, or in reverse order.

The inventive concept will now be described more fully hereinafter with reference to the accompanying drawings, in which exemplary embodiments of the inventive concept are shown.

FIG. 1 is a block diagram of a fuse data reading circuit 100 according to an embodiment of the inventive concept. The fuse data reading circuit 100 may be formed as part of an integrated circuit, such as part of a semiconductor chip.

Referring to FIG. 1, the fuse data reading circuit 100 may include a controller 110 configured to control a multiplexer 120, a row selector 130, and a sensing unit 150, the multiplexer 120 configured to selectively output a first sensing voltage Vs1 or a second sensing voltage Vs2, the row selector 130 configured to apply a read voltage Vr and a sensing voltage Vs output by the multiplexer 120 to a selected row of a fuse array, the fuse array 140 in which a plurality of fuse cells are arrayed, and the sensing unit 150 configured to sense fuse data stored in the fuse cells.

The controller 110 may output a sensing voltage selection control signal SCVs to the multiplexer 120, output a row selection control signal SCR to the row selector 130 to apply the read voltage Vr and the sensing voltage Vs output by the multiplexer 120 to a predetermined row of the fuse array, and output a sensing control signal SCS for controlling the sensing of the data stored in the fuse cells to the sensing unit 150.

The multiplexer 120 may receive the first sensing voltage Vs1 and the second sensing voltage Vs2, select the first sensing voltage Vs1 or the second sensing voltage Vs2 as the sensing voltage Vs in response to the sensing voltage selection control signal SCVs, and output the sensing voltage Vs to the row selector 130.

For example, the multiplexer 120 may selectively output the first sensing voltage Vs1 when the sensing voltage selection control signal SCVs is at a logic high, and output the second sensing voltage Vs2 when the sensing voltage selection control signal SCVs is at a logic low.

Here, the first sensing voltage Vs1 may have a higher voltage level than the second sensing voltage Vs2. In the present embodiment, the first sensing voltage Vs1 may be applied to the fuse array 140 during a transition period that comes directly after a fuse data reading operation is enabled in response to a power-up signal after the application of an external voltage, while the second sensing voltage Vs2 may be applied to the fuse array 140 during a stabilized period in which DC circuits of a semiconductor memory device may stably output voltages.

In the transition period, the sensitivity of a sense amplifier circuit of the sensing unit 150 may be increased by applying the first sensing voltage Vs1 higher than the second sensing voltage Vs2 to word reading lines WRL1 to WRLm. Thus, the occurrence of reading errors in the fuse data due to low sensitivity may be prevented during the transition period.

In response to the row selection control signal SCR, the row selector 130 may apply the sensing voltage Vs output by the multiplexer 120 to a word reading line WRL of a predetermined row of the fuse array, and apply the read voltage Vr to a word line WL of the predetermined row thereof.

For instance, the row selector 130 may be configured with a plurality of switches corresponding to respective rows. When a logic-high row selection control signal SCR is applied to a switch corresponding to a second row, the sensing voltage Vs output by the multiplexer 120 may be applied to a word reading line WRL2 of the second row, and the read voltage Vr may be applied to a word line WL2 of the second row.

The fuse array 140 may include a plurality of fuse cells arrayed as a matrix type in m rows and n columns.

Figure 2:
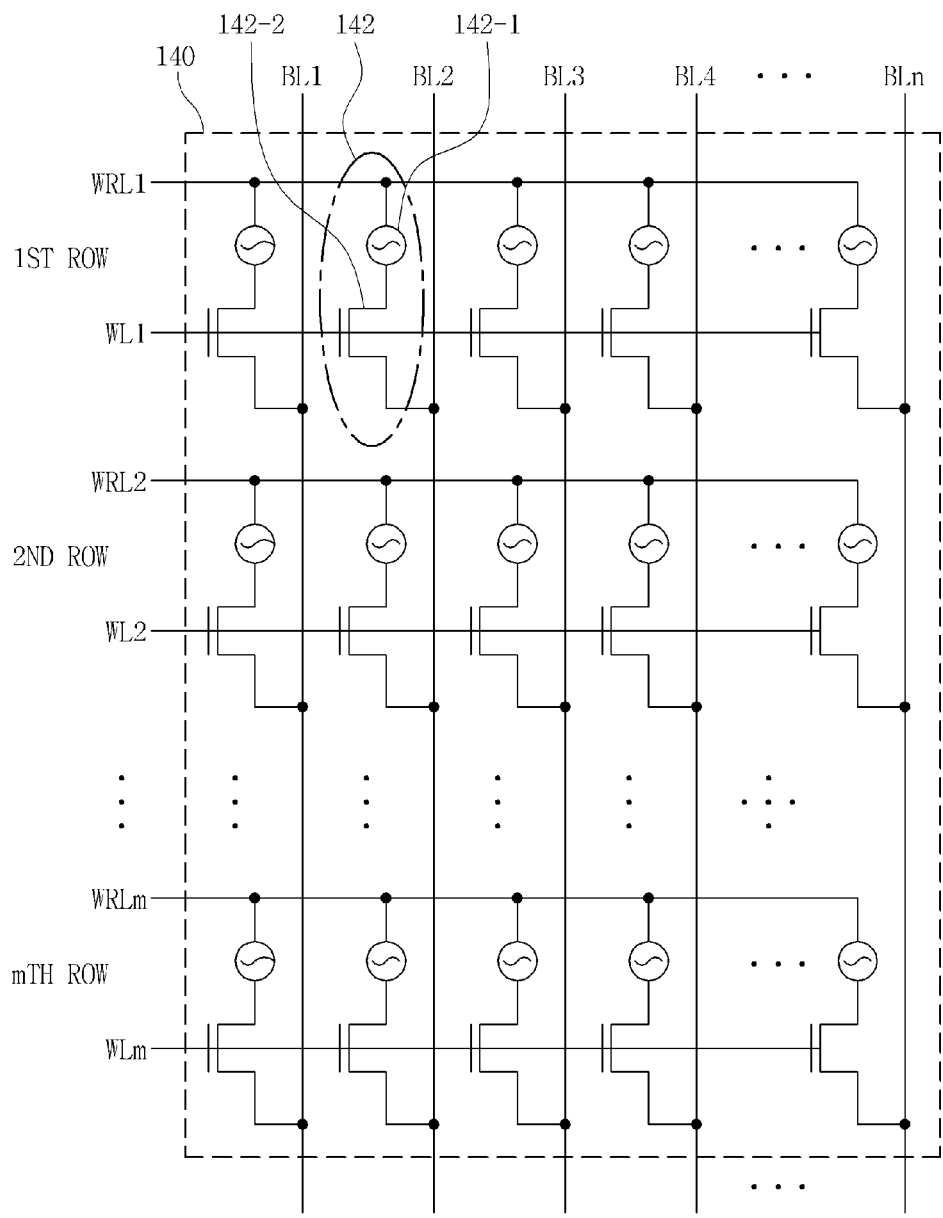
FIG. 2 is a diagram of a fuse array according to an embodiment of the inventive concept.

FIG. 2 is a diagram of a fuse array 140 according to an embodiment of the inventive concept.

Referring to FIG. 2, the fuse array 140 may include a plurality of fuse cells 142, each of which may store information therein. Each of the fuse cells 142 may include a laser fuse or an electrical fuse, which may also constitute an anti-fuse. As used in this disclosure, a generic reference to "fuse" (e.g., as with "fuse cells") includes both a regular fuse, which may be normally closed unless the fuse is "cut" later (e.g., with a laser or an electrical signal), and to an anti-fuse, which may be normally open, unless altered (e.g., with a laser or electrical signal) to be closed (e.g., to create an electrical conductive path). Connection of the laser fuse may be controlled with the irradiation of a laser beam, and connection of the electrical fuse may be controlled with the application of an electric signal. Also, the anti-fuse may make the transition from a high resistance state to a low resistance state in response to an electric signal (e.g., a high-voltage signal) or irradiation of a laser beam.

In this example, it is assumed that the fuse cell 142 is an anti-fuse cell including an anti-fuse. Also, information stored in the anti-fuse cell may be called fuse data.

The fuse array 140 may have an array structure in which anti-fuse cells 142 are arrayed at respective intersections between a plurality of rows and a plurality of columns. For example, when the fuse array 140 has m rows and n columns, the fuse array 140 may have m×n anti-fuse cells 142.

The fuse array 140 may include M word lines WL1 to WLm configured to access the anti-fuse cells 142 disposed in the m rows, and N bit lines BL1 to BLn disposed to correspond to n columns to transmit information read from the anti-fuse cells 142.

The fuse array 140 may store various pieces of information related to operations of a semiconductor memory device. For example, the fuse array 140 may store setting information required to determine operating environments of the semiconductor memory device, and the setting information may be programmed by changing the resistance state of the anti-fuse cells 142 with the application of a programming voltage Vpp to the anti-fuse cells 142. Unlike a typical fuse circuit such as a laser fuse circuit or an electrical fuse circuit, the anti-fuse cell 142 may initially exhibit a high-resistance state and make the transition from the high-resistance state to a low-resistance state due to a program operation to store information. Each of the anti-fuse cells 142 may have a capacitor structure including two conductive layers and a dielectric layer interposed between the two conductive layers. Each of the anti-fuse cells 142 may be programmed by breaking down the dielectric layer with the application of a high voltage between the two conductive layers, to connect the two conductive layers to form an electrical conductive path between the two conductive layers.

In embodiments of the inventive concept, each of the anti-fuse cells 142 may include a fuse 142-1 and a selection transistor 142-2. Here, the selection transistor 142-2 may be a metal-oxide-semiconductor field-effect transistor (MOSFET), and the fuse 142-1 may be a fuse capacitor or a MOSFET-type fuse transistor.

When the fuse 142-1 is a fuse capacitor, one end of the fuse capacitor may be connected to the word reading line WRL, and the other end thereof may be connected to a source/drain terminal of one end of the selection transistor 142-2.

When the fuse 142-1 is a fuse transistor, a gate of the fuse transistor may be connected to the word reading line WRL, one source/drain terminal of one end of the fuse transistor may be floated, and the other source/drain terminal of the other end of the fuse transistor may be connected to a source/drain terminal of one end of the selection transistor 142-2.

A gate of the selection transistor 142-2 may be connected to the word line WL, and a source/drain terminal of the other end of the selection transistor 142-2 may be connected to the bit line BL.

The programming of a fuse cell disposed in a specific row and a specific column may include applying a program voltage Vpp to a word reading line WRL of the specific row and adjusting a voltage of a word line WL of the specific row and a bit line voltage of the specific column under predetermined conditions to break down a fuse.

Information stored in the fuse array 140 may be read by each of the rows. To this end, any one word line may be selected, and the remaining word lines may be unselected. When a first row to which the anti-fuse cell 142 of FIG. 2 belongs is selected, a predetermined sensing voltage Vs may be applied to the word reading line WRL1, and a predetermined read voltage Vr may be applied to the word line WL1. Also, during a read operation of the fuse array 140, all bit lines may be precharged to 0V, and voltages of 0V may be applied to word reading lines and word lines of unselected rows.

When the anti-fuse cell 142 is programmed, fuse data corresponding to a logic high may be output through the sensing unit 150; whereas when the anti-fuse cell 142 is not programmed, fuse data corresponding to a logic low may be output through the sensing unit 150.

The sensing unit 150 may sense and amplify data stored in the fuse cells of the fuse array 140 in response to the sensing control signal SCS and output the sensed and amplified data.

Figure 3:
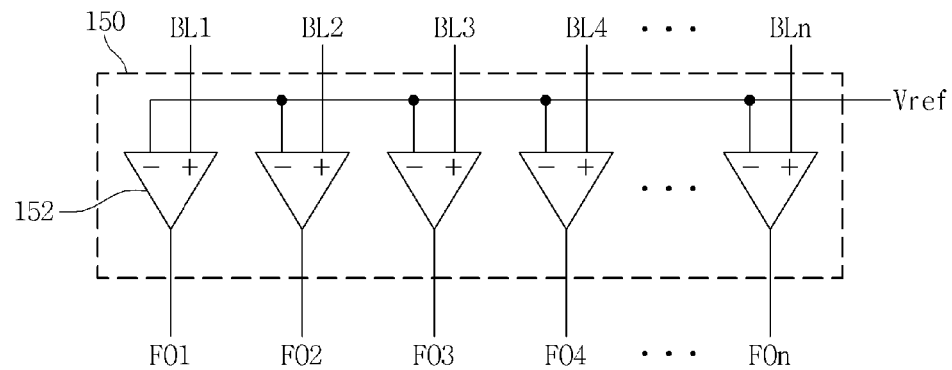
FIG. 3 is a construction diagram of a sensing unit according to the embodiment shown in FIG. 1.

FIG. 3 is a construction diagram of the sensing unit 150 according to the embodiment shown in FIG. 1.

Referring to FIG. 3, the sensing unit 150 may include sense amplifier circuits corresponding respectively to n bit lines BL1 to BLn, and each of the sense amplifier circuits may include a sense amplifier 152. A positive (+) terminal of the sense amplifier 152 may be connected to the corresponding one of the bit lines BL1 to BLn, and a negative (−) terminal thereof may be connected to a predetermined reference voltage Vref. The sense amplifiers 152 may respectively output signals FO1 to FOn corresponding to fuse data stored in fuse cells connected to the corresponding bit lines BL1 to BLn.

In a case where a specific fuse cell (that is an anti-fuse cell) is selected to read fuse data, when the specific fuse cell is programmed, a bit line connected to the specific fuse cell may be charged in response to a sensing voltage Vs applied to the fuse cell, and a voltage of the corresponding bit line may increase and become higher than the reference voltage Vref. Accordingly, the sense amplifier 152 may output the output signal FO corresponding to a logic-high signal, and the logic-high output signal FO may become read fuse data.

In addition, when the specific fuse cell is not programmed, the specific fuse cell may serve as an open circuit, and the sensing voltage Vs applied to the specific fuse cell may not affect the corresponding bit line so that the corresponding bit line can be maintained at a voltage of 0V, which is lower than the reference voltage Vref. Accordingly, the sense amplifier 152 may output the output signal FO corresponding to a logic-low signal, and the logic-low output signal FO may be read fuse data. Output signals FO having the opposite polarity in logic may be obtained when the specific fuse is a regular fuse (i.e., not an anti-fuse). Thus, a regular fuse may output the output signal FO with a logic-low when the regular fuse is programmed, and output the signal FO with a logic-high when the regular fuse is not programmed.

Figure 4:
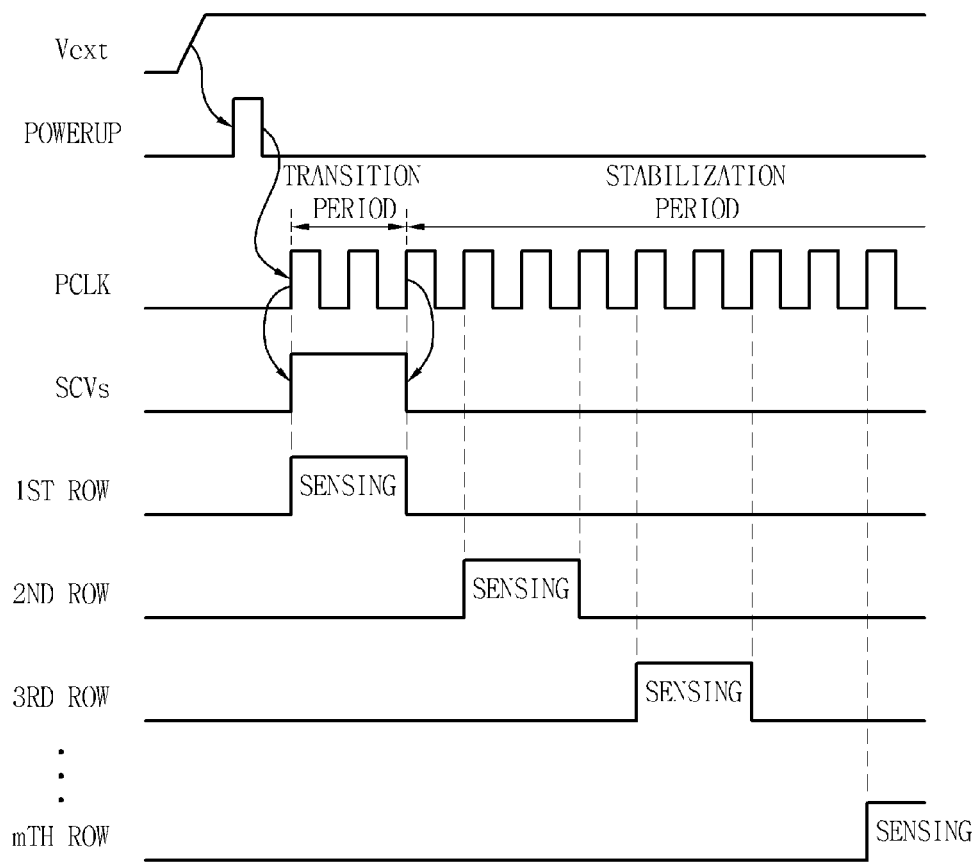
FIG. 4 is a timing diagram illustrating a fuse data reading operation according to the embodiment shown in FIG. 1.

FIG. 4 is a timing diagram illustrating a fuse data reading operation according to the embodiment shown in FIG. 1.

Referring to FIGS. 1 and 4, when an external voltage Vext is applied to a semiconductor memory device, a power-up signal may be generated, and driving voltages may be applied to various circuits included in the semiconductor memory device in response to the power-up signal. A clock signal generator included in the semiconductor memory device may generate a clock signal PCLK in response to an oscillation signal generated by an oscillator configured to receive an oscillation voltage of the driving voltages.

The controller 110 may generate a row selection control signal SCR in response to the clock signal PCLK and apply a read voltage Vr and a sensing voltage Vs to a selected row of the fuse array 140.

The controller 110 may recognize the end of the transition period and the entry into the stabilized period during the third rising edge of the clock signal PCLK. The end of the transition period may be recognized by counting a number of clock edges (e.g., determining a PCLK has generated a predetermined number of clock edges, such as three rising clock edges). In the transition period, the controller 110 may maintain the sensing voltage selection control signal SCVs at a logic high so that the first sensing voltage Vs1 may be applied to a word reading line WRL of the fuse array 140. In the stabilized period, the controller 110 may maintain the sensing voltage selection control signal SCVs at a logic low so that the second sensing voltage Vs2 may be applied to a word reading line of the fuse array 140.

First through m-th rows of the fuse array 140 may be sequentially enabled in response to the row selection control signal SCR output by the controller 110, and fuse data stored in the fuse cells of the enabled row may be sensed and read. For example, controller 110 may output an incrementing count as the row selection control signal SCR, and row selector 130 may decode the incrementing SCR signal each corresponding sensing period to read a corresponding word line WL of the fuse array 140 (e.g., in FIG. 4, each sensing period for the $1^{st}$ to m-th row) by activating the corresponding word line WL and associated word reading line WRL.

In the present embodiment, the controller 110 may be configured to determine the end of the transition period by the number of input clocks of clock signal PCLK. However, in some embodiments, the controller 110 may include a timer and determine the end of the transition period at a time point when a predetermined amount of time has elapsed after the clock signal PCLK is generated. Alternatively, the controller 110 may include an internal voltage detector configured to detect an internal voltage, and determine the end of the transition period at a time point when the internal voltage has reached a target voltage having a predetermined level.

Figure 5:
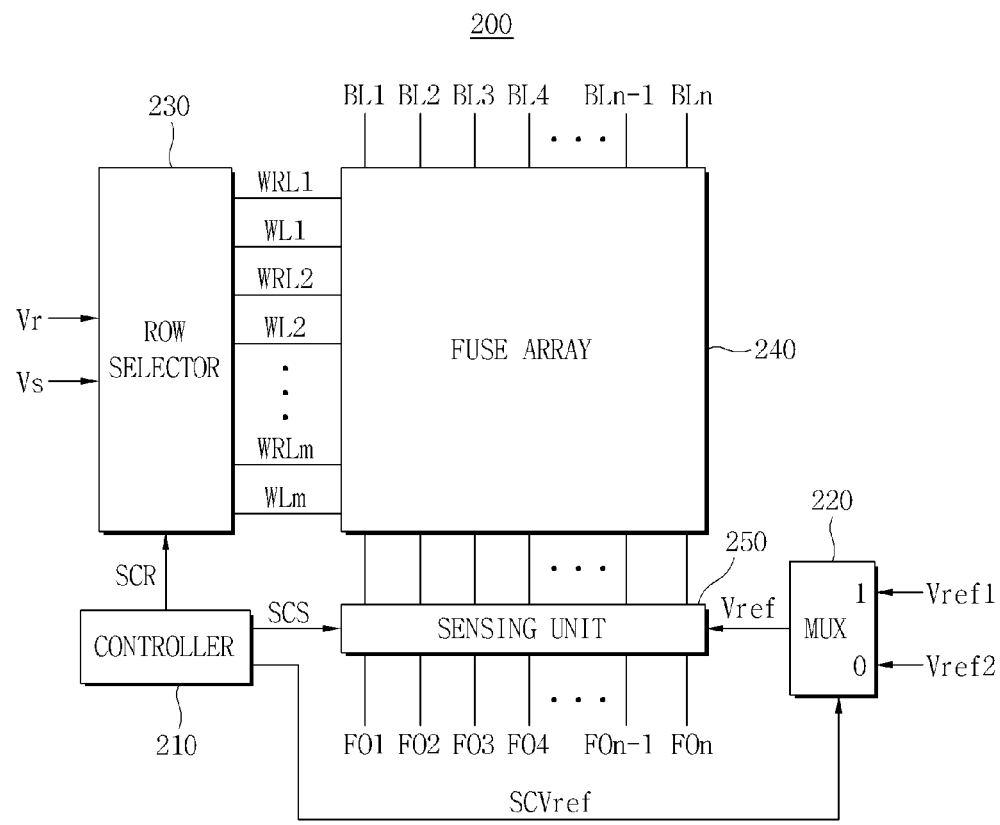
FIG. 5 is a block diagram of a fuse data reading circuit according to an embodiment of the inventive concept.

FIG. 5 is a block diagram of a fuse data reading circuit 200 according to an embodiment of the inventive concept.

Referring to FIG. 5, the fuse data reading circuit 200 may include a controller 210 configured to control a multiplexer 220, a row selector 230, and a sensing unit 250, the multiplexer 220 configured to selectively output a first reference voltage Vref1 or a second reference voltage Vref2, the row selector 230 configured to apply a read voltage Vr and a sensing voltage Vs to a selected row of a fuse array 240, the fuse array 240 in which a plurality of fuse cells are arranged, and a sensing unit 250 configured to sense fuse data stored in the fuse cells.

The controller 210 may output a reference voltage selection control signal SCVref to the multiplexer 220, output a row selection control signal SCR for applying the read voltage Vr and the sensing voltage Vs to a specific row of the fuse array 240, and output a sensing control signal SCS for controlling the sensing of fuse data to the sensing unit 250.

The multiplexer 220 may receive the first reference voltage Vref1 and the second reference voltage Vref2, select the first reference voltage Vref1 or the second reference voltage Vref2 as a reference voltage Vref in response to the reference voltage selection control signal SCVref, and output the reference voltage Vref to the sensing unit 250.

For instance, the multiplexer 220 may selectively output the first reference voltage Vref1 when the reference voltage selection control signal SCVref is at a logic high, and selectively output the second reference voltage Vref2 when the reference voltage selection control signal SCVref is at a logic low. The reference voltage Vref output by the multiplexer 220 may be applied to a reference voltage input terminal of a sense amplifier included in the sensing unit 250.

In this case, the first reference voltage Vref1 may be lower than the second reference voltage Vref2. In the present embodiment, the first reference voltage Vref1 may be applied to the sensing unit 250 during a transition period that comes directly after a fuse data reading operation is enabled in response to a power-up signal, while the second reference voltage Vref2 may be applied to the sensing unit 250 during a stabilized period in which DC circuits of a semiconductor memory device may stably output voltages.

In the transition period, a first reference voltage lower than a second reference voltage may be applied to the reference voltage input terminal of the sense amplifier of the sensing unit 250 so that the sensitivity of a sense amplifier circuit can increase. Therefore, reading errors in fuse data, which may occur due to low sensitivity during the transition period, may be prevented.

In response to the row selection control signal SCR, the row selector 230 may apply the sensing voltage Vs to a word reading line WRL of a specific row of the fuse array 240, and apply the read voltage Vr to a word line WR of the specific row thereof.

For instance, the row selector 230 may be configured with a plurality of switches corresponding to respective rows. When a logic-high row selection control signal SCR is applied to a switch corresponding to a specific row, the sensing voltage Vs may be applied to the word reading line WRL of the specific row, and the read voltage Vr may be applied to the word line WR of the specific row.

The fuse array 240 may include a plurality of fuse cells arrayed in m rows and n columns. Since the fuse array 240 and its operation may be the same as described with reference to FIG. 2, a detailed description thereof will be omitted.

The sensing unit 250 may sense and amplify data stored in the fuse cells of the fuse array 240 in response to the sensing control signal SCS and output the sensed and amplified data.

Figure 6:
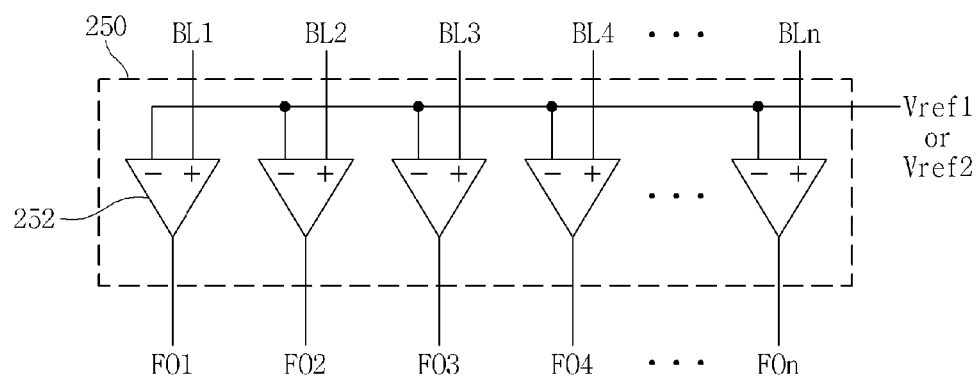
FIG. 6 is a construction diagram of a sensing unit according to the embodiment shown in FIG. 5.

FIG. 6 is a construction diagram of the sensing unit 250 according to the embodiment shown in FIG. 5.

Referring to FIG. 6, the sensing unit 250 may include sense amplifier circuits corresponding respectively to n bit lines BL1 to BLn, and the sense amplifier circuit may include a sense amplifier 252. A positive (+) terminal of the sense amplifier 252 may be connected to the corresponding bit line, and a negative (−) terminal thereof may be connected to the first reference voltage Vref1 or the second reference voltage Vref2 output by the multiplexer 220. The sense amplifiers 252 may respectively output output signals FO1 to FOn corresponding to fuse data stored in fuse cells connected to the corresponding bit lines BL1 to BLn.

In a case where a specific fuse cell is selected to read fuse data, when the specific fuse cell is programmed, a bit line connected to the specific fuse cell may be charged by a sensing voltage Vs applied to the specific fuse cell, and a voltage of the corresponding bit line may increase and become higher than the reference voltage Vref output by the multiplexer 220. Accordingly, the sense amplifier 252 may output an output signal FO corresponding to a logic-high signal, and the logic-high output signal FO may become read fuse data.

In addition, when the specific fuse cell is not programmed, the specific fuse cell may serve as an open circuit, and the sensing voltage Vs applied to the specific fuse cell may not affect the corresponding bit line so that the corresponding bit line can be maintained at a voltage of 0V, which is lower than the reference voltage Vref output by the multiplexer 220. Accordingly, the sense amplifier 252 may output the output signal FO corresponding to a logic-low signal, and the logic-low output signal FO may be read fuse data.

Figure 7:
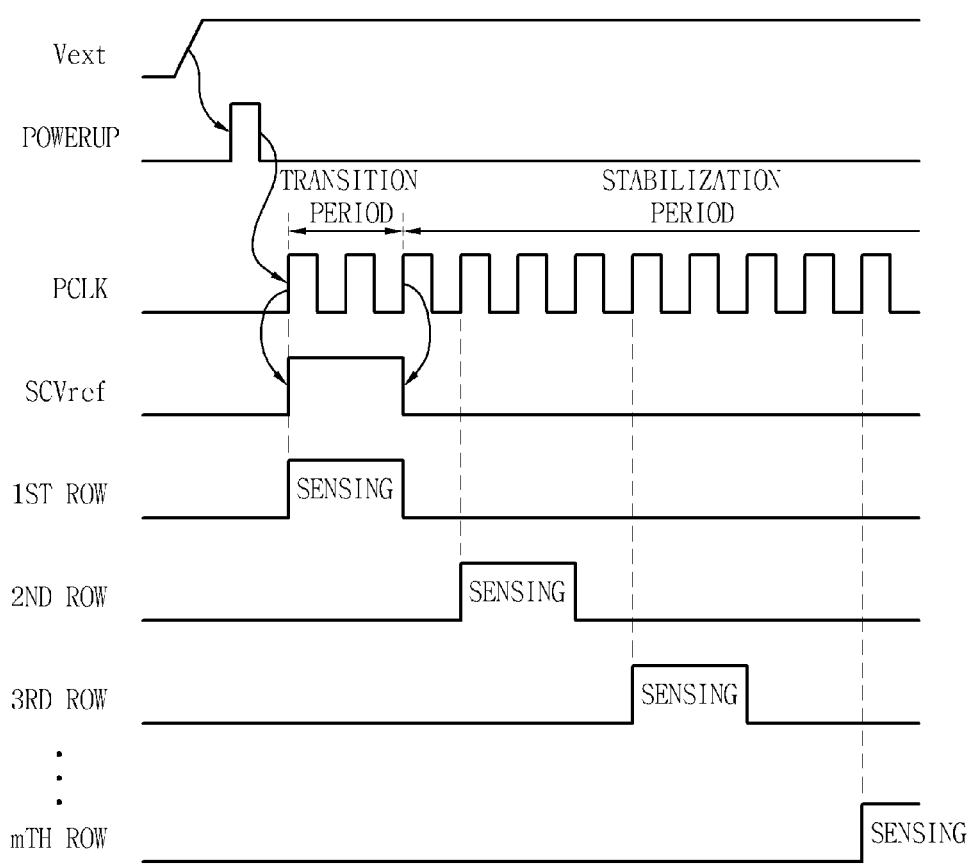
FIG. 7 is a timing diagram illustrating a fuse data reading operation according to the embodiment shown in FIG. 5.

FIG. 7 is a timing diagram illustrating a fuse data reading operation according to the embodiment shown in FIG. 5.

Referring to FIGS. 5 and 7, when an external voltage Vext is applied to a semiconductor memory device, a power-up signal may be generated, and driving voltages may be applied to various circuits included in the semiconductor memory device in response to the power-up signal. A clock signal generator included in the semiconductor memory device may generate a clock signal PCLK in response to an oscillation signal generated by an oscillator configured to receive an oscillation voltage of the driving voltages.

The controller 210 may generate a row selection control signal SCR in response to the clock signal PCLK and apply a read voltage Vr and a sensing voltage Vs to a selected row of the fuse array 240.

The controller 210 may recognize during a third rising edge of the clock signal PCLK that the transition period ends and a stabilized period begins. The controller 210 may maintain the reference voltage selection control signal SCVref at a logic high during the transition period so that the first reference voltage Vref1 may be applied to a reference voltage input terminal of the sense amplifier of the sensing unit 250. The controller 210 may maintain the reference voltage selection control signal SCVref at a logic low during the stabilized period so that the second reference voltage Vref2 may be applied to the reference voltage input terminal of the sense amplifier of the sensing unit 250.

The respective rows of the fuse array 240 may be sequentially enabled in response to the row selection control signal SCR output by the controller 210, and fuse data stored in the fuse cells of the enabled row may be sensed and read.

In the present embodiment, the controller 210 may be configured to determine the end of the transition period by the number of input clocks of clock signal PCLK. However, in some embodiments, the controller 210 may include a timer and determine the end of the transition period at a time point when a predetermined amount of time has elapsed after the clock signal PCLK is generated. Alternatively, the controller 210 may include an internal voltage detector configured to detect an internal voltage, and determine the end of the transition period at a time point when the internal voltage has reached a target voltage having a predetermined level. Other features and alternatives of this embodiment, including their structure and/or operation, may the same as the other embodiments described herein (including use of plural sensing voltages Vs1 and Vs2) and need not be repeated here.

Figure 8:
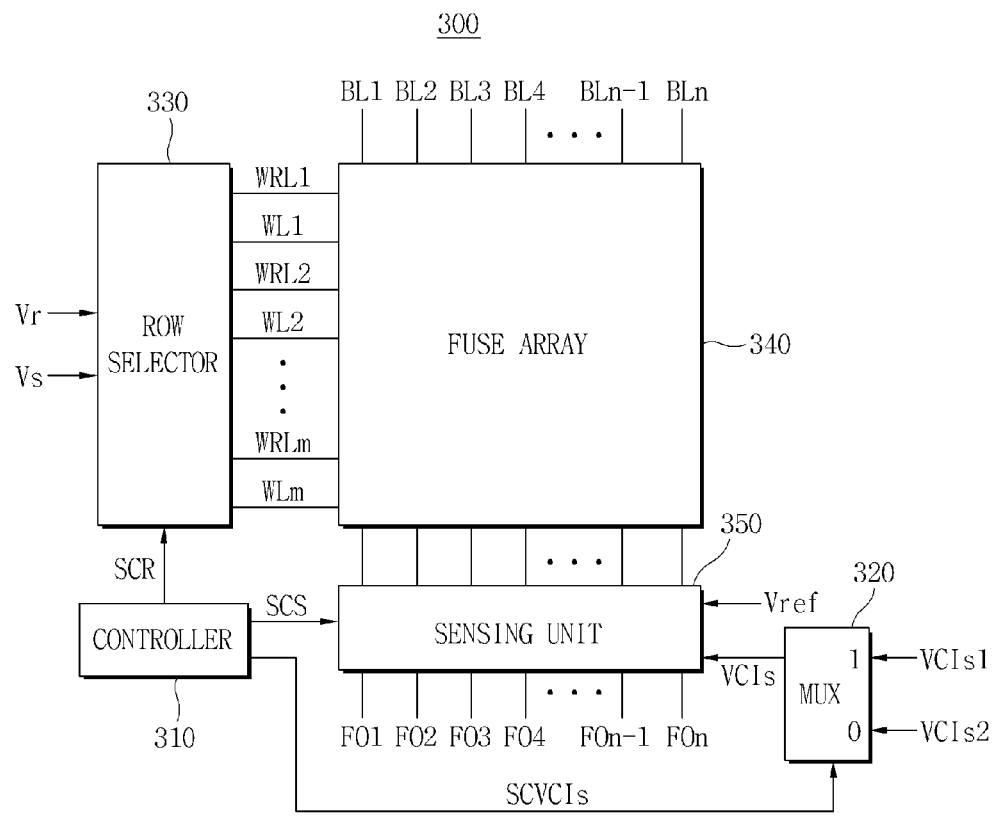
FIG. 8 is a block diagram of a fuse data reading circuit according to an embodiment of the inventive concept.

FIG. 8 is a block diagram of fuse data reading circuit 300 according to an embodiment of the inventive concept.

Referring to FIG. 8, the fuse data reading circuit 300 may include a controller 310 configured to control a multiplexer 320, a row selector 330, and a sensing unit 350, the multiplexer 320 configured to selectively output a first sensing current control voltage VCIs1 or a second sensing current control voltage VCIs2, the row selector 330 configured to apply a read voltage Vr and a sensing voltage Vs to a selected row of a fuse array 340, the fuse array 340 in which a plurality of fuse cells are arrayed, and a sensing unit 350 configured to sense fuse data stored in the fuse cells.

The controller 310 may output a sensing current control voltage selection control signal CSVCIs to the multiplexer 320, output a row selection control signal SCR for applying the read voltage Vr and the sensing voltage Vs to a selected specific row of the fuse array 340 to the row selector 330, and output a sensing control signal SCS for controlling the sensing of the fuse data to the sensing unit 350.

The multiplexer 320 may receive the first sensing current control voltage VCIs1 and the second sensing current control voltage VCIs2, select the first sensing current control voltage VCIs1 or the second sensing current control voltage VCIs2 as a sensing current control voltage VCIs in response to the sensing current control voltage selection control signal SCVCIs, and output the sensing current control voltage VCIs to the sensing unit 350.

For example, the multiplexer 320 may selectively output the first sensing current control voltage VCIs1 when the sensing current control voltage selection control signal SCVCIs is at a logic high, and selectively output the second sensing current control voltage VCIs2 when the sensing current control voltage selection control signal SCVCIs is at a logic low. The sensing current control voltage VCIs output by the multiplexer 320 may be applied to a sensing current source of a sense amplifier circuit included in the sensing unit 350.

Here, the first sensing current control voltage VCIs1 may be lower than the second sensing current control voltage VCIs2. In the present embodiment, the first sensing current control voltage VCIs1 may be applied to the sensing unit 350 during a transition period that comes directly after a fuse data reading operation is enabled in response to a power-up signal, while the second sensing current control voltage VCIs2 may be applied to the sensing unit 350 during a stabilized period in which DC circuits of a semiconductor memory device may stably output voltages.

In the transition period, the first sensing current control voltage VCIs1 lower than the second sensing current control voltage VCIs2 may be applied to a sensing current source of the sense amplifier circuit of the sensing unit 350, thereby reducing a sensing current to increase the sensitivity of fuse data. Therefore, reading errors in fuse data, which may occur due to low sensitivity during the transition period, may be prevented.

In response to the row selection control signal SCR, the row selector 330 may apply the sensing voltage Vs to a word reading line WRL of a specific row of the fuse array 340, and apply the read voltage Vr to a word line WL of the specific row thereof.

For example, the row selector 330 may be configured with a plurality of switches corresponding to the respective rows. When a logic-high row selection control signal SCR is applied to a switch corresponding to a specific row, a sensing voltage Vs may be applied to a word reading line of the specific row, and a read voltage Vr may be applied to a word line of the specific row.

The fuse array 340 may include a plurality of fuse cells arrayed in m rows and n columns. Since the fuse array 340 is the same as described with reference to FIG. 2, a detailed description thereof will be omitted. Other features and alternatives of this embodiment, including their structure and/or operation, may the same as the other embodiments described herein (including use of plural sensing voltages Vs1 and Vs2 and/or plural reference voltages Vref1 and Vref2) and need not be repeated here.

The sensing unit 350 may sense and amplify data stored in the fuse cells of the fuse array 340 in response to the sensing control signal SCS and output the sensed and amplified data.

Figure 9:
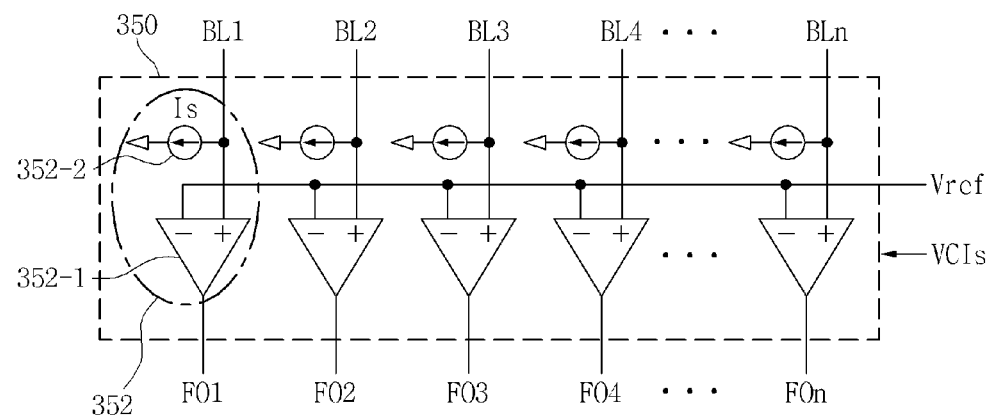
FIG. 9 is a construction diagram of a sensing unit according to the embodiment shown in FIG. 8.

FIG. 9 shows exemplary details of the sensing unit 350 according to the embodiment shown in FIG. 8.

Referring to FIG. 9, the sensing unit 350 may include sense amplifier circuits 352 corresponding respectively to n bit lines BL1 to BLn, and each of the sense amplifier circuits 352 may include a sense amplifier 352-1 and a sensing current source 352-2. A positive (+) terminal of the sense amplifier 352-1 may be connected to the corresponding one of the bit lines BL1 to BLn, and a negative (−) terminal of the sense amplifier 352-1 may be connected to a reference voltage Vref. The sense amplifiers 352-1 may respectively output output signals FO1 to FOn corresponding to fuse data stored in the fuse cells connected to the corresponding bit lines BL1 to BLn.

One end of the sensing current source 352-2 may be connected to the corresponding one of the bit lines BL1 to BLn, and the other end thereof may be grounded. The sensing current source 352-2 may be connected to allow the flow of a sensing current in a ground direction. The sensing current source 352-2 may be a voltage-controlled current source. The sensing current control voltage VCIs output by the multiplexer 320 may be applied to the sensing current source 352-2 of each of the sense amplifier circuits 352 to control the sensing current of each of the sense amplifier circuits 352.

The sensing unit 350 may be configured such that the sensing current becomes larger with an increase in the sensing current control voltage VCIs applied to the sensing current source 352-2.

In the present embodiment, due to a low sensing current control voltage VCIs, a smaller sensing current may flow to the ground in the transition period than in the stabilized period. Thus, a voltage of the bit lines BL1 to BLn may be increased in the transition period relative to the stabilized period to increase the sensitivity of the sense amplifier circuits 352.

Figure 10:
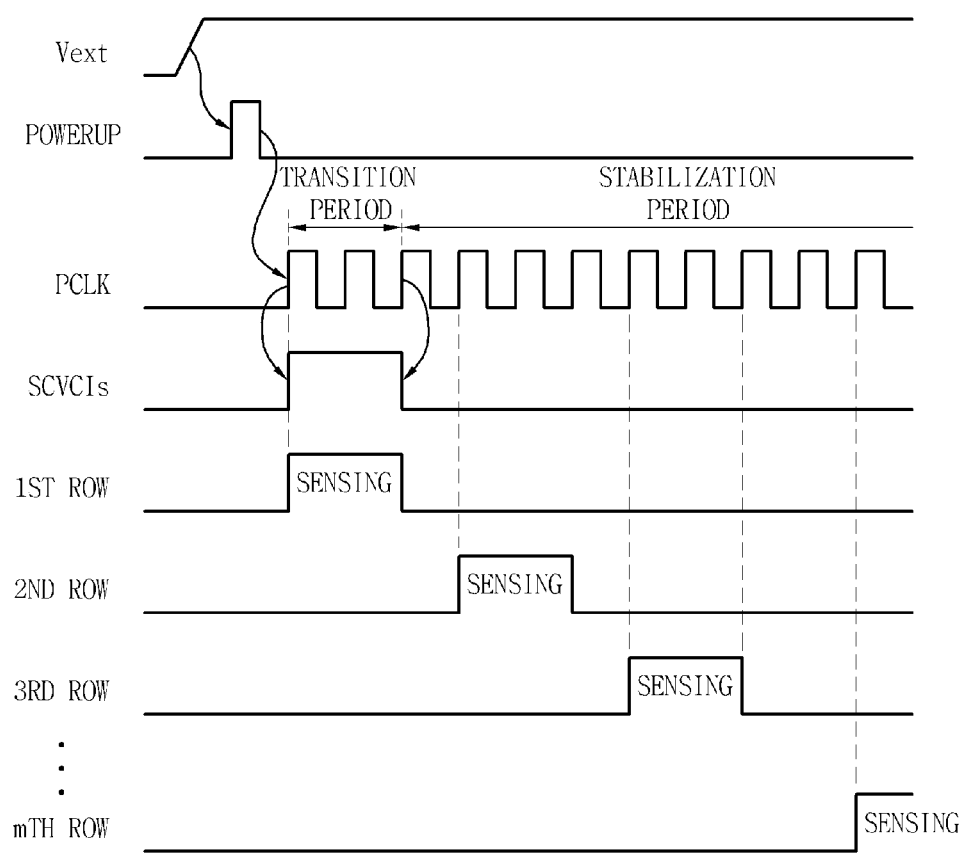
FIG. 10 is a timing diagram illustrating a fuse data reading operation according to the embodiment shown in FIG. 8.

FIG. 10 is a timing diagram illustrating a fuse data reading operation according to the embodiment shown in FIG. 8.

Referring to FIGS. 8 and 10, when an external voltage Vext is applied to a semiconductor memory device, a power-up signal may be generated, and driving voltages may be applied to various circuits included in the semiconductor memory device in response to the power-up signal. A clock signal generator included in the semiconductor memory device may generate a clock signal PCLK in response to an oscillation signal generated by an oscillator configured to receive an oscillation voltage of the driving voltages.

The controller 310 may generate the row selection control signal SCR in response to the clock signal PCLK and apply a read voltage Vr and a sensing voltage Vs to a selected row of the fuse array 340.

The controller 310 may recognize the end of the transition period and the entry into the stabilized period during a third rising edge of the clock signal PCLK. In the transition period, the controller 310 may maintain the sensing current control voltage selection control signal SCVCIs at a logic high so that the first sensing current control voltage VCIs1 may be applied to the sensing current source 352-2 of the sense amplifier circuit of the sensing unit 350. In the stabilized period, the controller 310 may maintain the sensing current control voltage selection control signal SCVCIs at a logic low so that the second sensing current control voltage VCIs2 may be applied to the sensing current source 352-2 of the sense amplifier circuit thereof.

The respective rows of the fuse array 340 may be sequentially enabled in response to the row selection control signal SCR output by the controller 310, and fuse data stored in the fuse cells of the enabled row may be sensed and read.

Figure 11:
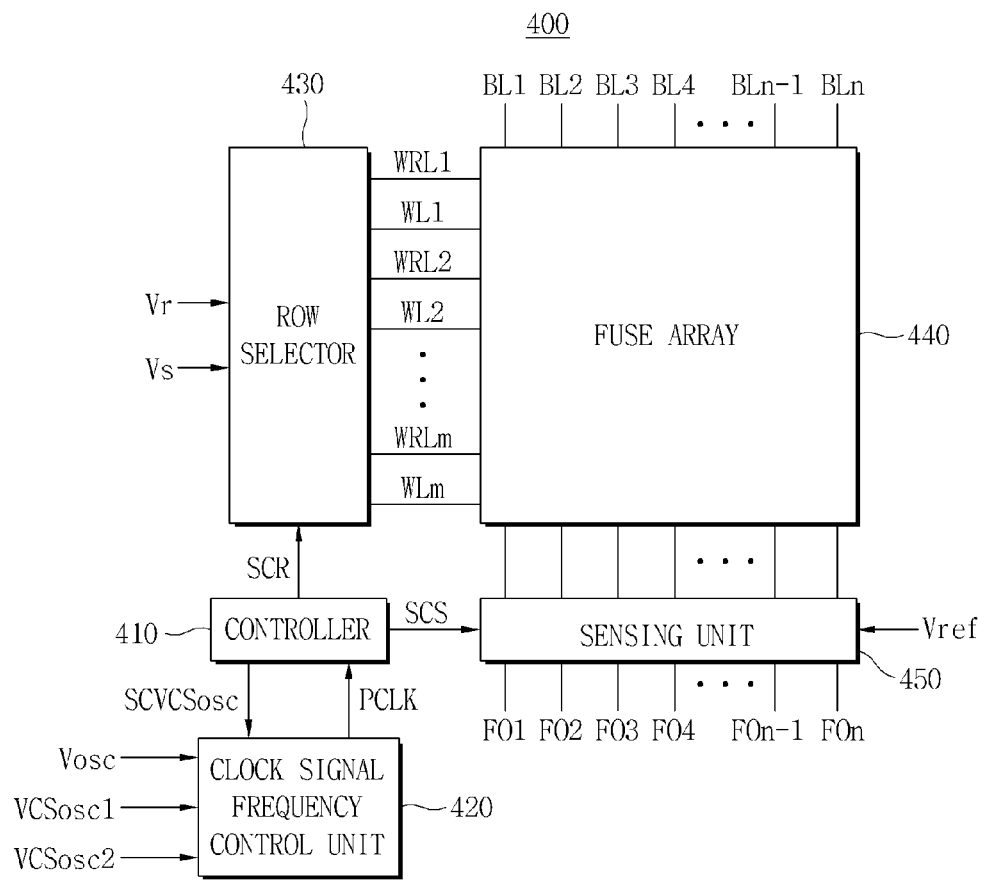
FIG. 11 is a block diagram of a fuse data reading circuit according to an embodiment of the inventive concept.

FIG. 11 is a block diagram of a fuse data reading circuit 400 according to an embodiment of the inventive concept.

Referring to FIG. 11, the fuse data reading circuit 400 may include a controller 410 configured to control a clock signal frequency controller 420, a row selector 430, and a sensing unit 450, a clock signal frequency controller 420 configured to control the frequency of a clock signal, the row selector 430 configured to apply a read voltage Vr and a sensing voltage Vs to a selected row of a fuse array 440, the fuse array 440 in which a plurality of fuse cells are arrayed, and the sensing unit 450 configured to sense fuse data stored in the fuse cells.

The controller 410 may output an oscillation signal control voltage selection control signal SCVCSosc to the clock signal frequency controller 420, output a row selection control signal SCR for applying the read voltage Vr and the sensing voltage Vr to a specific row of the fuse array 440, to the row selector 430, and output a sensing control signal SCS for controlling the sensing of fuse data to the sensing unit 450.

The controller 410 may receive a clock signal PCLK and control the row selector 430 and the sensing unit 450 in response to the clock signal PCLK.

The clock signal frequency controller 420 may generate and output a clock signal having a controlled frequency in response to the oscillation signal control voltage selection signal SCVCSosc.

Figure 12:
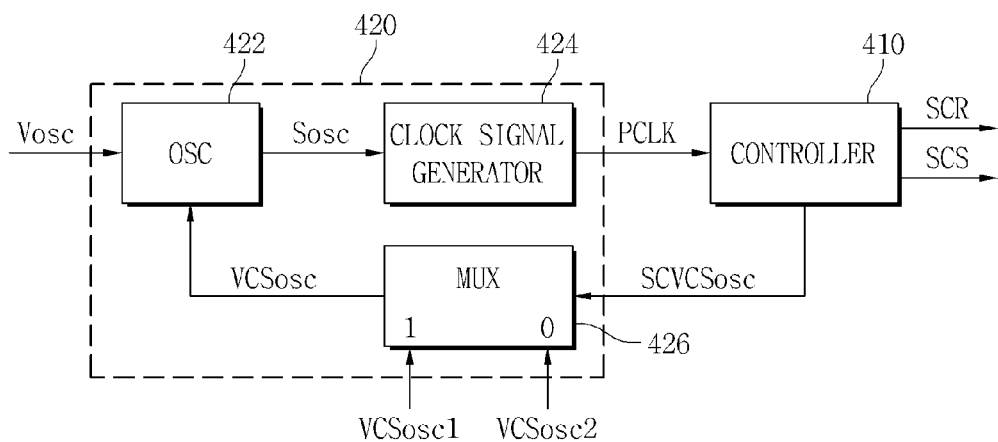
FIG. 12 is a block diagram of a clock signal frequency controller according to the embodiment shown in FIG. 11.

FIG. 12 is a block diagram of a clock signal frequency controller 420 according to the embodiment shown in FIG. 11.

Referring to FIG. 12, the clock signal frequency controller 420 may include an oscillator 422 configured to output an oscillation signal Sosc, a clock signal generator 424 configured to generate a clock signal PCLK using the oscillation signal Sosc, and a multiplexer 426 configured to output an oscillation signal control voltage VCSosc to the oscillator 422 in response to an oscillation signal control voltage selection control signal SCVCSosc.

The oscillator 422 may receive an oscillation voltage Vosc generated with the application of an external voltage, generate an oscillation signal Sosc having an oscillation frequency controlled according to the magnitude of an oscillation signal control voltage, and output the oscillation signal Sosc to the clock signal generator 424.

The frequency of the oscillation signal Sosc may become higher with an increase in the magnitude of the oscillation signal control voltage.

The clock signal generator 424 may generate and output a clock signal PCLK having a specific frequency (e.g., a frequency equal to the frequency of the oscillation signal Sosc).

The multiplexer 426 may receive a first oscillation signal control voltage VCSosc1 and a second oscillation signal control voltage VCSosc2. When the oscillation signal control voltage selection control signal SCVCSosc output by the controller 410 is at a logic high, the multiplexer 426 may select the first oscillation control voltage VCSosc1 as the oscillation signal control voltage VCSosc and output the first oscillation control voltage VCSosc1 to the oscillator 422. When the oscillation signal control voltage selection control signal SCVCSosc output by the controller 410 is at a logic low, the multiplexer 426 may select the second oscillation signal control voltage VCSosc2 as the oscillation signal control voltage VCSosc and output the second oscillation signal control voltage VCSosc2 to the oscillator 422. In this case, the first oscillation signal control voltage VCSosc1 may have a lower magnitude than the second oscillation signal control voltage VCSosc2.

In the embodiment of the inventive concept, the first oscillation signal control voltage VCSosc1 may be applied to the oscillator 422 during a transition period, and the second oscillation signal control voltage VCSosc2 may be applied to the oscillator 422 during a stabilized period. As a result, the frequency of a clock signal PCLK may be lower in the transition period than in the stabilized period, and sensing time for the same number of clocks of the clock signal may be longer in the transition period than in the stabilized period, thereby reducing reading errors in fuse data.

In response to the row selection control signal SCR, the row selector 430 may apply the sensing voltage Vs to a word reading line WRL of a specific row of the fuse array 440, and apply the read voltage Vr to a word line WL of the specific row thereof.

For example, the row selector 430 may be configured with a plurality of switches corresponding to the respective rows. When a logic-high row selection control signal SCR is applied to a switch corresponding to a specific row, the sensing voltage Vs may be applied to a word reading line WRL of the specific row, and the read voltage Vr may be applied to a word line WL of the specific row.

The fuse array 440 may include a plurality of fuse cells arrayed in m rows and n columns. Since the fuse array 440 is the same as described with reference to FIG. 2, a detailed description thereof will be omitted. Other features and alternatives of this embodiment, including their structure and/or operation, may the same as the other embodiments described herein (including use of plural sensing voltages Vs1 and Vs2 and/or plural reference voltages Vref1 and Vref2 and/or plural oscillation signal control voltage VCSosc1 and VCSosc2) and need not be repeated here.

The sensing unit 450 may sense and amplify data stored in the fuse cells of the fuse array 440 in response to the sensing control signal SCS and output the sensed and amplified data. Since the sensing unit 450 is the same as described with reference to FIG. 3, a detailed description thereof will be omitted.

Figure 13:
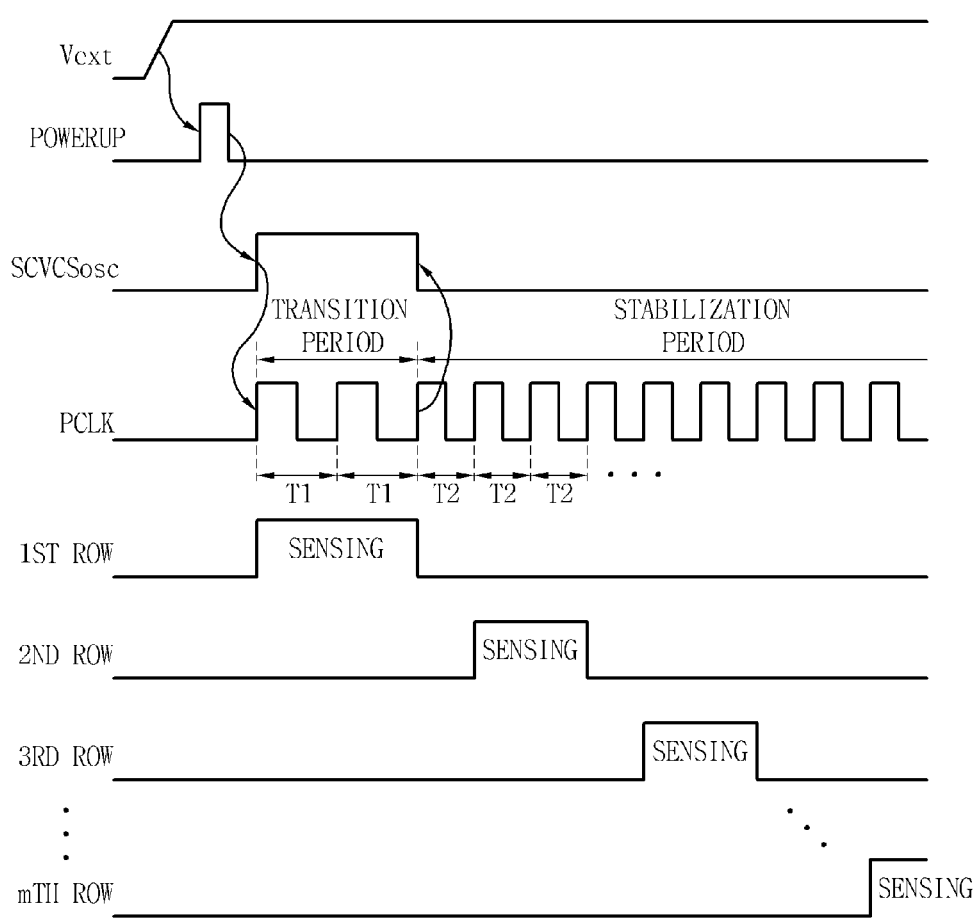
FIG. 13 is a timing diagram illustrating a fuse data reading operation according to the embodiment shown in FIG. 11.

FIG. 13 is a timing diagram illustrating a fuse data reading operation according to the embodiment shown in FIG. 11.

Referring to FIGS. 11 through 13, when an external voltage Vext is applied to a semiconductor memory device, a power-up signal may be generated, and driving voltages may be applied to various circuits included in the semiconductor memory device in response to the power-up signal. The controller 410, which has received a driving voltage, may output a logic-high oscillation signal control voltage selection control signal SCVCSosc.

In response to the logic-high oscillation signal control voltage selection control signal SCVCSosc, the multiplexer 426 may output a low-level first oscillation signal control voltage VCSosc1 to the oscillator 422 so that a clock signal PCLK having a cycle T1 may be generated and applied to the controller 410 during the transition period.

The controller 410 may recognize the end of the transition period and the entry into the stabilized period during a third rising edge of the clock signal PCLK, and output a logic-low oscillation signal control voltage selection control signal SCVCSosc during the third rising edge of the clock signal PCLK.

In response to the logic-low oscillation signal control voltage selection control signal SCVCSosc, the multiplexer 426 may output a high-level second oscillation signal control voltage VCSosc2 to the oscillator 422 so that a clock signal PCLK having a cycle T2 may be generated and applied to the controller 410 during the stabilized period.

In this case, the cycle T1 may be longer than the cycle T2. That is, the frequency of the clock signal PCLK may be lower in the transition period than in the stabilized period, and sensing time for the same number of clocks of the clock signal PCLK may be longer in the transition period than in the stabilized period, thereby reducing reading errors in fuse data during the transition period.

The respective rows of the fuse array 440 may be sequentially enabled in response to the row selection control signal SCR output by the controller 410, and fuse data stored in the fuse cells of the enabled row may be sensed and read.

Figure 14:
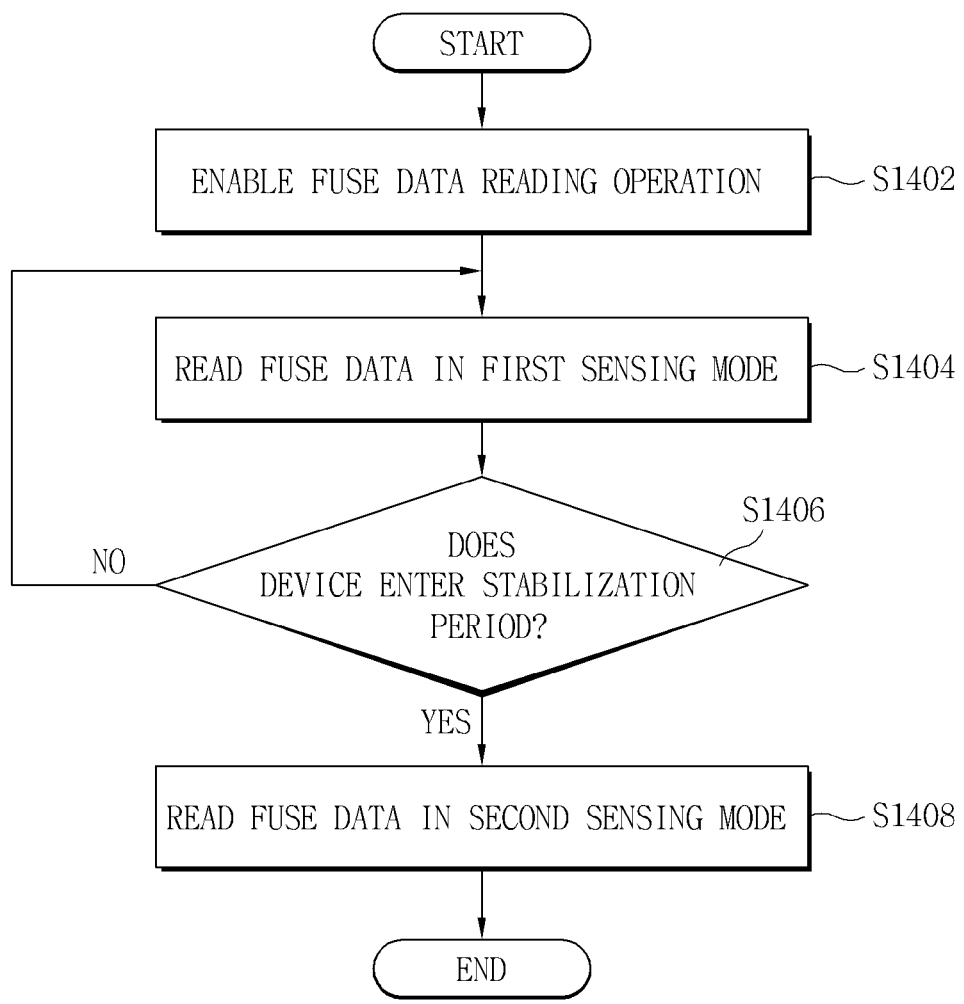
FIG. 14 is a flowchart illustrating a method of reading fuse data according to an embodiment of the inventive concept.

FIG. 14 is a flowchart illustrating a method of reading fuse data according to an embodiment of the inventive concept.

Referring to FIG. 14, a fuse data reading circuit may be initially enabled in response to the application of external power (operation S1402).

Next, fuse data may be read in a first sensing mode (operation S1404). Here, a sensing condition in the first sensing mode may be set such that the sensitivity of a sense amplifier configured to sense fuse data is higher in the first sensing mode than in a second sensing mode.

For example, to enable the reading of the fuse data in the first sensing mode, as compared to the second sensing mode, a sensing voltage applied to one end of a fuse cell may be relatively higher, a reference voltage applied to a reference voltage input terminal of a sense amplifier of a sense amplifier circuit may be relatively lower, a sensing current of a sensing current source connected between a bit line of the sense amplifier circuit and a ground may be relatively lower, and/or the frequency of a clock signal used to read the fuse data may be relatively lower.

Next, it may be determined whether a fuse data reading operation enters the stabilized period (operation S1406). It may be determined whether the fuse data reading operation enters the stabilized period by determining whether a predetermined number of clocks of clock signal are generated after generation of the clock signal used to read fuse data, determining whether a predetermined amount of time has elapsed after generation of the clock signal, or by determining whether an internal voltage of the device has reached a target voltage having a predetermined level.

Next, when it is determined in operation S1406 that the fuse data reading operation enters the stabilized period, the fuse data may be read in the second sensing mode (operation S1408). In the second sensing mode, the sense amplifier circuit configured to sense the fuse data may be set to a lower sensitivity than in the first sensing mode.

Figure 15:
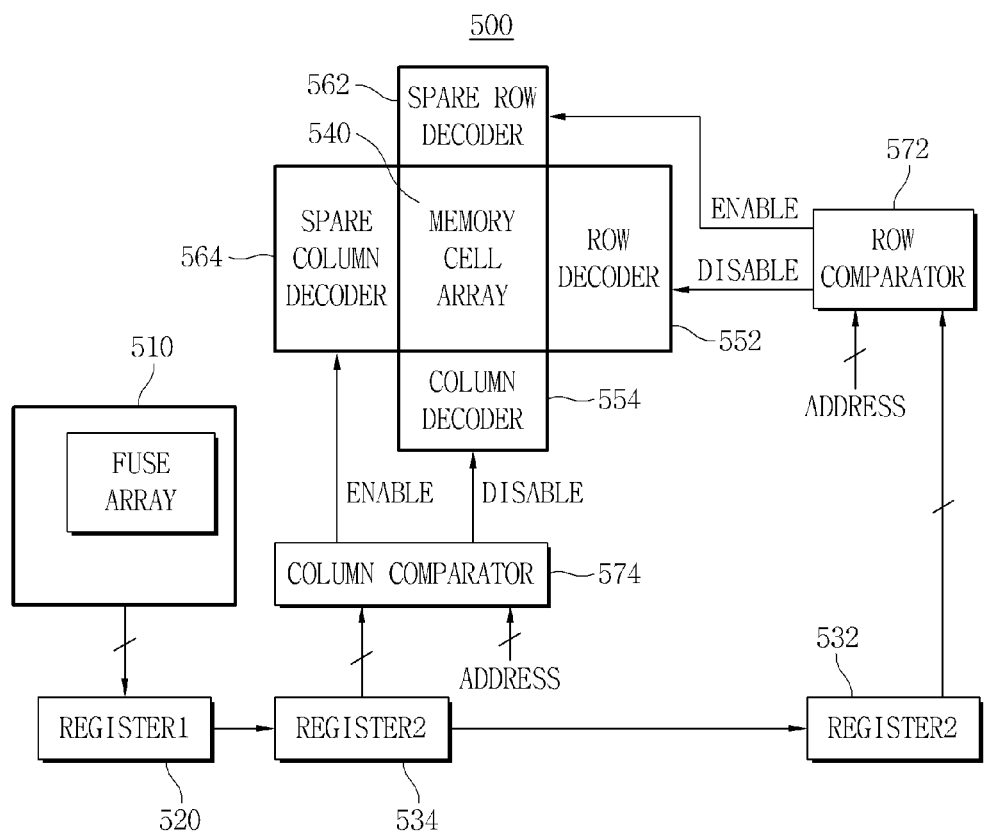
FIG. 15 is a block diagram of a semiconductor memory device according to an embodiment of the inventive concept.

FIG. 15 is a block diagram of a semiconductor memory device 500 according to an embodiment of the inventive concept.

Referring to FIG. 15, the semiconductor memory device 500 may include a fuse data reading circuit 510 including a fuse array, a first register unit 520 configured to store fuse data output by the fuse data reading circuit 510 and transmit the fuse data to second register units 532 and 534 configured to store the fuse data received from the first register unit 520, a memory cell array 540 configured to store data, row and column decoders 552 and 554 configured to drive word lines and bit lines of the memory cell array 540, spare row and spare column decoders 562 and 564 configured to drive redundant cells, and row and column comparators 572 and 574 configured to compare address information of a defective cell with external address information.

Any one of the embodiments described herein may constitute the fuse data reading circuit 510.

The first register unit 520 may store fuse data output by the fuse data reading circuit 510 and transmit the fuse data to the second register units 532 and 534. The operation of the semiconductor memory device may be set or controlled using the fuse data stored in the second register units 532 and 534.

The second register units 532 and 534 may sequentially receive single bits of fuse data from the first register unit 520 and store the received single bits of the fuse data. The second register units 532 and 534 may be disposed adjacent to various circuit blocks that may require the fuse data. For example, the second register unit 532 configured to store row address information regarding a defective cell (e.g., row addresses identifying word lines containing a defective cell) may be disposed adjacent to the row comparator 572. Also, the second register unit 534 configured to store column address information regarding the defective cell (e.g., column addresses identifying bit lines containing a defective cell) may be disposed adjacent to the column comparator 574.

The row comparator 572 may compare an external row address with the row address information regarding the defective cell and drive the row decoder 552 or the spare row decoder 562 based on the comparison result. Similarly, the column comparator 574 may compare an external column address with the column address information regarding the defective cell and drive the column decoder 554 or the spare column decoder 564 based on the comparison result.

Each of the row and column comparators 572 and 574 may include a plurality of logic devices configured to compare external address information with address information regarding the defective cell.

Figure 16:
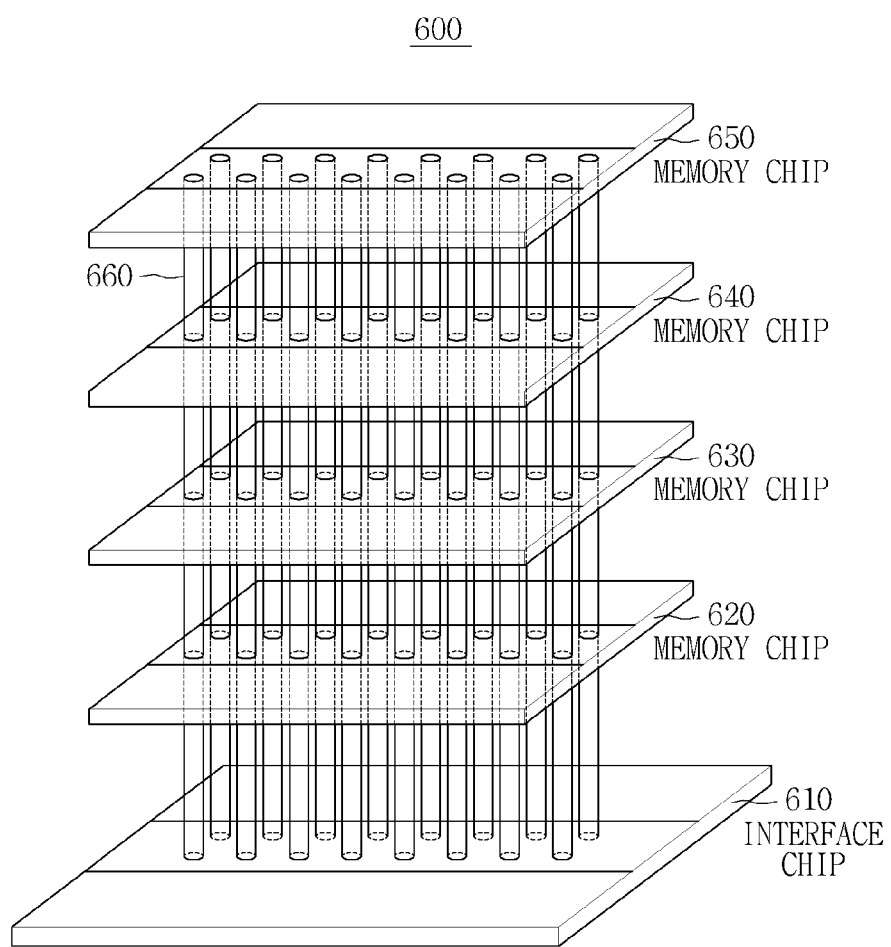
FIG. 16 is a simplified perspective view of a stack semiconductor device including semiconductor memory devices according to an embodiment of the inventive concept.

FIG. 16 is a simplified perspective view of a stack semiconductor device 600 including semiconductor memory devices according to an embodiment of the inventive concept.

Referring to FIG. 16, the stack semiconductor device 600 may include an interface chip 610 and memory chips 620, 630, 640, and 650 electrically connected to one another by through-silicon vias (TSVs) 660. Although FIG. 16 illustrates TSVs 660 disposed in two rows, the stack semiconductor device 600 may include an arbitrary number of TSVs 660.

Each of the memory chips 620, 630, 640, and 650 included in the stack semiconductor device 600 may include a fuse data reading circuit according to an embodiment of the inventive concept. The interface chip 610 may serve as an interface between the memory chips 620, 630, 640, and 650 and an external apparatus.

Figure 17:
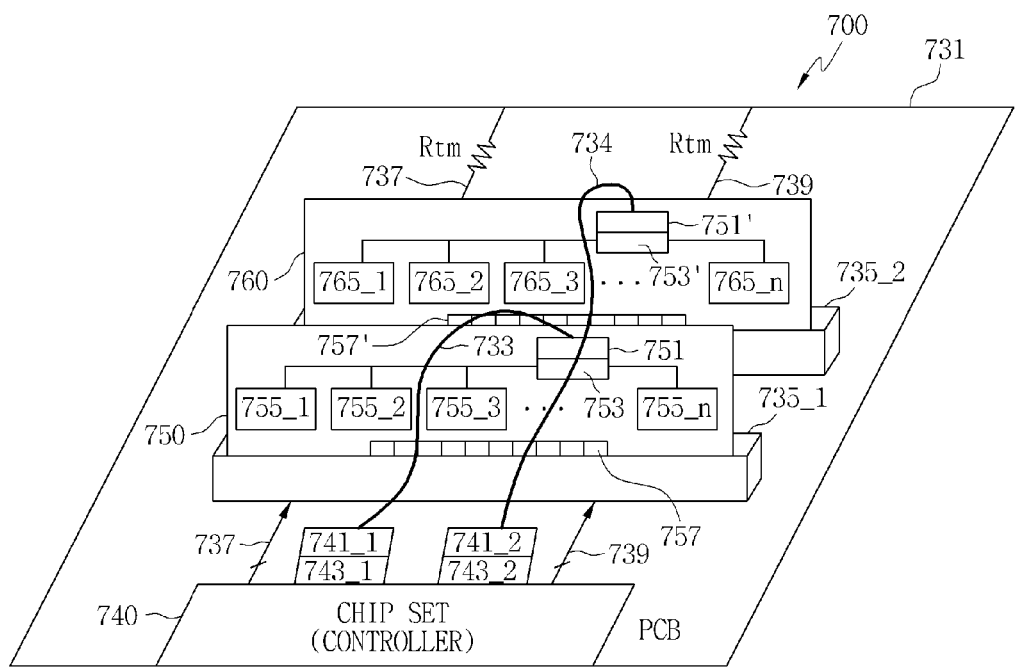
FIG. 17 is a diagram of an example of a memory system including a semiconductor memory device according to an embodiment of the inventive concept.

FIG. 17 is a diagram of an example of a memory system 700 including a semiconductor memory device according to an embodiment of the inventive concept.

Referring to FIG. 17, the memory system 700 may include a motherboard 731, a chipset (or controller) 740, slots 735_1 and 735_2, memory modules 750 and 760, and transmission wires 733 and 734. Buses 737 and 739 may connect the chipset 740 to the slots 735_1 and 735_2. A terminal resistor Rtm may terminate each of the buses 737 and 739 disposed on a printed circuit board (PCB) of the mother board 731.

Although FIG. 17 illustrates two slots 735_1 and 735_2 and two memory modules 750 and 760 for brevity, the memory system 700 may include an arbitrary number of slots and an arbitrary number of memory modules.

The chipset 740 may be mounted on the PCB of the mother board 731 and control operation of the memory system 700. The chipset 740 may include connectors 741_1 and 741_2 and converters 743_1 and 743_2.

The converter 743_1 may receive parallel data generated by the chipset 740, convert the parallel data into serial data, and output the serial data to the transmission wire 733 through the connector 741-1. The converter 743_1 may receive serial data through the transmission wire 733, convert the serial data into parallel data, and output the parallel data to the chipset 740.

The converter 743_2 may receive the parallel data generated by the chipset 740, convert the parallel data into serial data, and output the serial data to the transmission wire 734 through the connector 741-2. The converter 743_2 may receive serial data through the transmission wire 734, convert the serial data into parallel data, and output the parallel data to the chipset 740. The transmission wires 733 and 734 included in the memory system 700 may be a plurality of optical fibers.

The memory module 750 may include a plurality of memory devices 755_1 to 755_n, a first connector 757, a second connector 751, and converters 753. The memory module 760 may include a plurality of memory devices 765_1 to 765_n, a first connector 757', a second connector 751', and converters 753'.

The first connector 757 may transmit a low-speed signal from the chipset 740 to the memory devices, while the second connector 751 may be connected to the transmission wire 733 configured to transmit a high-speed signal.

The converter 753 may receive serial data through the second connector 751, convert the serial data into parallel data, and output the parallel data to the plurality of memory devices 755_1 to 755_n. Also, the converter 753 may receive parallel data from the plurality of memory devices 755_1 to 755_n, convert the parallel data into serial data, and output the serial data to the second connector 751.

Each of the plurality of memory devices 755_1 to 755_n and 765_1 to 765_n shown in FIG. 17 may include a fuse data reading circuit according to an embodiment of the inventive concept. Accordingly, each of the plurality of memory devices 755_1 to 755_9 and 765_1 to 765_n may include an anti-fuse-type fuse array according to an embodiment of the inventive concept. Each of the plurality of memory devices 755_1 to 755_n, 765_1 to 765_n may include a volatile memory chip, such as a dynamic random access memory (DRAM) or a static RAM (SRAM), a non-volatile memory chip, such as a flash memory, a phase-change memory, a magnetic RAM (MRAM), or a resistive RAM (RRAM), or a combination thereof.

Figure 18:
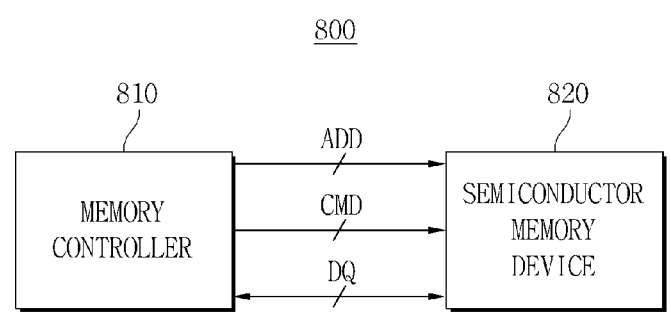
FIG. 18 is a block diagram of a memory system according to an embodiment of the inventive concept.

FIG. 18 is a block diagram of a memory system 800 according to an embodiment of the inventive concept.

Referring to FIG. 18, the memory system 800 may include a memory controller 810 and a semiconductor memory device 820.

The memory controller 810 may generate an address signal ADD and a command CMD and provide the address signal ADD and the command CMD to the semiconductor memory device 820 through buses. Data DQ may be transmitted from the memory controller 810 to the semiconductor memory device 820 through the buses, or transmitted from the semiconductor memory device 820 to the memory controller 810 through the buses. Memory controller 810 may read fuse data of a fuse array in semiconductor memory device 820 as part of an initiation sequence. The semiconductor memory device 820 may be any one of the semiconductor memory devices described herein, and operate in a like manner. For example, memory controller 810 (or another device, not shown) may apply or cause power to be applied to semiconductor memory device 820. During a power up sequence, fuse data may be read from the semiconductor memory device fuse array. The fuse data may be read with first read conditions and second read conditions, according to any of the embodiments described herein. Some or all of the fuse data may be transmitted to the memory controller 810. For example, the fuse data may reflect operation characteristics of the semiconductor memory device. The memory controller 810 may then operate according to the received fuse data, such as control the semiconductor device at a certain speed and/or timing.

The semiconductor memory device 820 may be the semiconductor memory device according to the above-described embodiment.

The inventive concept may be applied to a semiconductor memory device. In particular, the inventive concept may be effectively applied to a semiconductor memory device having a fuse array configured to store fuse data.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A fuse data reading circuit comprising:
   a fuse array including a plurality of fuse cells configured to store fuse data;
   a sensing circuit configured to sense the fuse data stored in the fuse cells of the fuse array; and
   a controller configured to control reading of the fuse data stored in the fuse cells, the controller being configured to read out of the fuse array first data of the fuse data with a first reading mode having first fuse data sensing conditions during a transition period and to read out of the fuse array second data of the fuse data with a second reading mode having second fuse data sensing conditions during a stabilized period, wherein the second fuse data sensing conditions are different from the first fuse data sensing conditions, and the controller is configured to select the first reading mode and second reading mode sequentially in accordance with time lapse after the enabling of the fuse data reading circuit,
   wherein the first fuse data sensing conditions cause higher sensitivity for sensing the fuse data during the transition period as compared to sensitivity for sensing the fuse data during the stabilized period caused by the second fuse data sensing conditions.

2. The circuit of claim 1,
   wherein the controller is configured to control reading in the first reading mode during the transition period that occurs directly after the fuse data reading operation is enabled, and the controller is configured to control reading in the second reading mode during the stabilized period that comes after the transition period.

3. The circuit of claim 1, wherein a start of the stabilized period is determined in response to at least one of:
   a predetermined number of clocks of a clock signal being generated, the clock signal being used to read the fuse data,
   a predetermined amount of time having elapsed after the clock signal is generated, and
   an internal voltage of a device having reached a target voltage after an external voltage is applied.

4. The circuit of claim 1, wherein the controller is configured to control reading of the fuse data such that a sensing voltage applied to the fuse cells in the transition period is higher than a sensing voltage applied to the fuse cells in the stabilized period.

5. The circuit of claim 1, wherein the controller is configured to control reading of the fuse data such that a reference voltage applied to a sense amplifier of the sensing circuit in the transition period is lower than a reference voltage applied to the sense amplifier of the sensing circuit in the stabilized period.

6. The circuit of claim 1, wherein the controller is configured to control reading of the fuse data such that a sensing current of a sensing current source of a sense amplifier circuit of the sensing circuit in the transition period is smaller than a sensing current of the sensing current source of the sense amplifier circuit of the sensing circuit in the stabilized period.

7. The circuit of claim 1, wherein the controller is configured to control a frequency of a clock signal used to read the fuse data such that the frequency of the clock signal is lower in the transition period than in the stabilized period.

8. The circuit of claim 1, wherein each of the plurality of fuse cells comprises an anti-fuse.

9. The circuit of claim 1,
   wherein each of the fuse cells comprises a fuse including a first terminal and a second terminal, and a selection transistor, the selection transistor including a gate terminal, a first source/drain and a second source/drain, the first source/drain of the transistor being connected to the first terminal of the fuse,
   wherein the fuse array comprises:
   a plurality of rows and a plurality of columns, the plurality of fuse cells being disposed at respective intersections of the rows and the columns;
   a word reading line connected to second terminals of fuses of a first set of the fuse cells;
   a word line connected to gate terminals of selection transistors of each of the first set of fuse cells; and
   a plurality of bit lines, each connected to the second source/drain terminal of a respective one of the selection transistors of the first set of the fuse cells, and
   wherein the sensing circuit includes a plurality of sense amplifiers each having a first terminal connected to a respective one of the bit lines and having a second terminal connected to a reference voltage.

10. The circuit of claim 9, wherein the controller is configured to control reading of the fuse data to sequentially read the fuse data from the respective rows of the fuse array.

11. The circuit of claim 9,
wherein the controller is configured to change sensing conditions so that the first sensing conditions and the second sensing conditions differ in at least one of: a sensing voltage applied to the word reading line and the reference voltage.

12. The circuit of claim 9, wherein the sensing circuit further includes a plurality of sensing current sources each having a first end connected to a respective one of the bit lines and having a grounded second end, and
wherein the controller is configured to change sensing conditions so that first sensing conditions and the second sensing conditions include different currents of the sensing current sources.

13. The circuit of claim 9, wherein the controller is configured to change sensing conditions so that first sensing conditions and the second sensing conditions include a different frequency of a clock signal used to read the fuse data.

14. A method of reading fuse data within a semiconductor device, comprising:
enabling a fuse data reading operation in response to application of a voltage external to the semiconductor device;
reading out of a fuse array of the semiconductor device first data of fuse data under a first sensing condition for sensing the fuse data in a first mode during a transition period;
entering a second mode of the fuse data reading operation; and
reading out of the fuse array second data of the fuse data under a second sensing condition for sensing the fuse data when the fuse data reading operation enters the second mode during a stabilized period,
wherein the first sensing condition for sensing the first data of the fuse data in the first mode is different from the second sensing condition for sensing the second data of the fuse data in the second mode, and
wherein the first sensing condition for sensing the fuse data in the first mode causes a higher data sensing sensitivity of a sensing circuit configured to sense the fuse data than a data sensing sensitivity of the sensing circuit in the second mode.

15. A method of operating a semiconductor device comprising a sensing circuit configured to sense data with different sensing conditions, comprising:
after power is applied to the semiconductor device, as part of a power-up sequence:
receiving first data read from a fuse array during a first mode of the semiconductor device with first sensing conditions;
then, receiving second data read from the fuse array during a second mode of the semiconductor device with second sensing conditions, the second sensing conditions being different from the first sensing conditions; and
then, controlling operation of the first semiconductor device in response to the received first and second data,
wherein the first sensing conditions of the first mode cause a higher data sensing sensitivity of the sensing circuit than a data sensing sensitivity of the sensing circuit when configured to sense data with second sensing conditions of the second mode.

16. The method of claim 15,
wherein the first sensing conditions include reading the first data with a word reading line voltage having a first magnitude, and
wherein the second sensing conditions include reading the second data with a word reading line voltage having a second magnitude, less than the first magnitude.

17. The method of claim 15,
wherein the first sensing conditions include comparing a first reference voltage to voltages provided on bit lines of the fuse array by first fuse cells of the fuse array to determine data stored in the first fuse cells; and
wherein the second sensing conditions include comparing a second reference voltage to voltages provided on bit lines of the fuse array by second fuse cells of the fuse array to determine data stored in the second fuse cells, the second reference voltage being higher than the first reference voltage.

18. The method of claim 15,
wherein the first sensing conditions include applying a first control voltage to current sources connected to bit lines of the fuse array, and
wherein the second sensing conditions include applying a second control voltage to the current sources,
wherein the first control voltage is effective to cause reduced sensing currents of the current sources as compared to a sensing currents caused by the second control voltage.

19. The method of claim 15,
wherein the first sensing conditions include reading the first data with a clock as the clock has a first frequency, and
wherein the second sensing conditions include reading the second data with the clock as the clock has a second frequency, the second frequency being higher than the first frequency.

20. The method of claim 14,
wherein the fuse data is stored in a plurality of fuse cells of a fuse array, each fuse cell comprising a first terminal connected to a corresponding word reading line, a second terminal connected to a corresponding bit line, and a fuse and selection transistor connected in series between the first terminal and the second terminal, the selection transistor including a gate terminal connected to a corresponding word line,
wherein reading the first data comprises applying a first sensing voltage to a first word reading line of the fuse array,
wherein reading the second data comprises applying a second sensing voltage to a second word reading line of the fuse array,
wherein the second sensing voltage has a lesser magnitude than the first sensing voltage.

21. The circuit of claim 1,
wherein each fuse cell of the fuse array comprises a first terminal, a second terminal, and a fuse and selection transistor connected in series between the first terminal and the second terminal, the selection transistor including a gate terminal,
wherein the fuse array further comprises:
a plurality of rows, the plurality of fuse cells being disposed in respective rows;
a plurality of word reading lines, each connected to first terminals of fuse cells of a corresponding row of the fuse cells, and
a plurality of word lines, each connected to gate terminals of selection transistors of a corresponding row of the fuse cells, and
wherein the controller is configured to apply a first word reading line voltage of a first magnitude to a first word reading line of the word reading lines during the first reading mode and to apply a second word reading line voltage of a second magnitude, less than the first magnitude, to a second word reading line of the word reading lines during the second reading mode.

* * * * *